(12) United States Patent
Ohkubo

(10) Patent No.: US 8,223,313 B2
(45) Date of Patent: Jul. 17, 2012

(54) LIGHT INTENSITY DISTRIBUTION MEASUREMENT APPARATUS AND MEASUREMENT METHOD, AND EXPOSURE APPARATUS

(75) Inventor: Akinori Ohkubo, Tucson, AZ (US)

(73) Assignee: Canon Kabushiki Kaisha, Tokyo (JP)

( * ) Notice: Subject to any disclaimer, the term of this patent is extended or adjusted under 35 U.S.C. 154(b) by 762 days.

(21) Appl. No.: 12/353,541

(22) Filed: Jan. 14, 2009

(65) Prior Publication Data

US 2009/0180094 A1  Jul. 16, 2009

(30) Foreign Application Priority Data

Jan. 16, 2008  (JP) ................................. 2008-007205

(51) Int. Cl.
*G03B 27/42* (2006.01)
(52) U.S. Cl. ................. 355/53; 355/55; 355/67; 355/72
(58) Field of Classification Search .................... 355/53, 355/72, 55, 67
See application file for complete search history.

(56) References Cited

U.S. PATENT DOCUMENTS

2006/0274297 A1* 12/2006 Ogusu ............................ 355/71

OTHER PUBLICATIONS

W. Partlo et al., Direct aerial image measurement as a method of testing high numerical aperture microlithographic lenses, *J. Vac. Sci. Technol. B.*, Nov./Dec. 1993, vol. 11, No. 6, pp. 2686-2691.

\* cited by examiner

*Primary Examiner* — Edward Glick
*Assistant Examiner* — Mesfin T Asfaw
(74) *Attorney, Agent, or Firm* — Canon U.S.A., Inc. IP Division

(57) ABSTRACT

A measurement apparatus which illuminates a pattern inserted on the object plane of an optical system, and measures a light intensity distribution corresponding to the pattern formed on the image plane of the optical system includes a sensor. The sensor includes a light-shielding member having a slit and a plurality of light-receiving units, wherein the light-shielding member is inserted on the image plane of the optical system and rotates and scans, and the plurality of light-receiving units receive light transmitted through the slit. The measurement apparatus controls rotation of the light-shielding member, on the basis of the positional relationship between the plurality of light-receiving units, and the phase differences between the signals detected by the plurality of light-receiving units arising from the scan of the light-shielding member.

8 Claims, 11 Drawing Sheets

FIG. 2
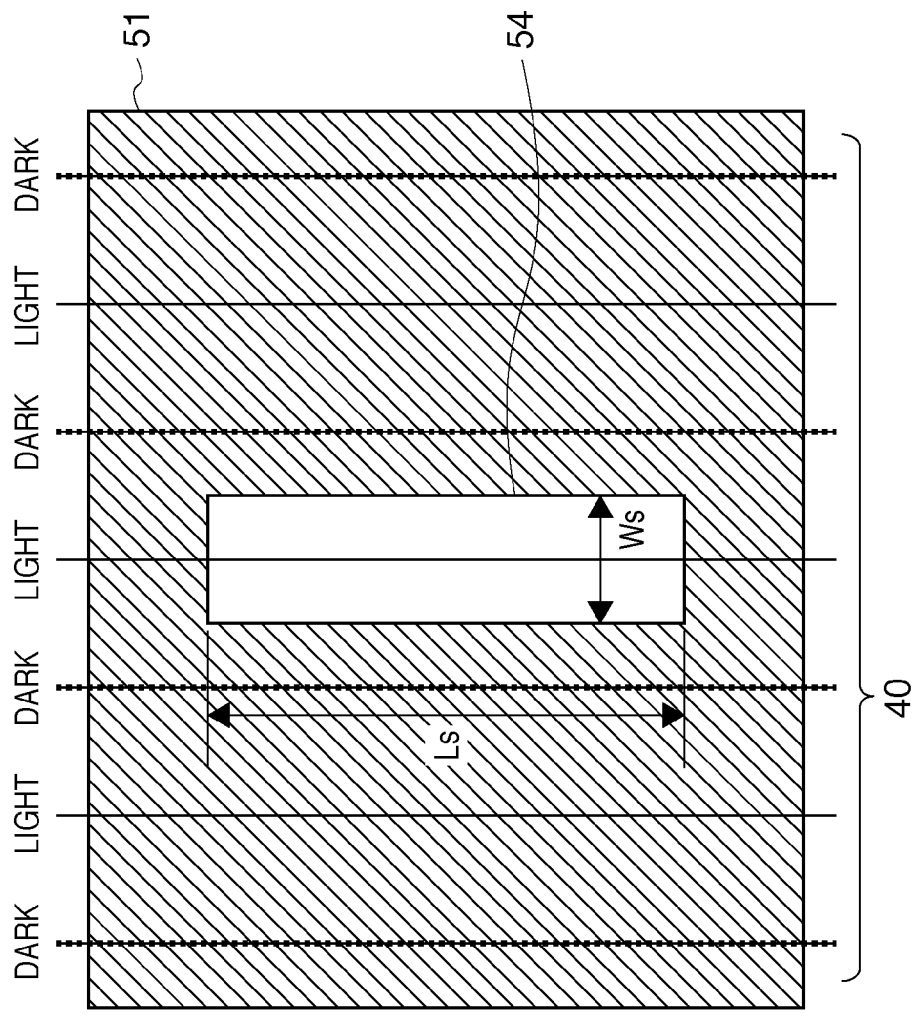
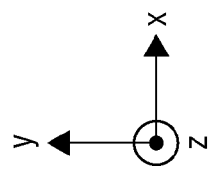

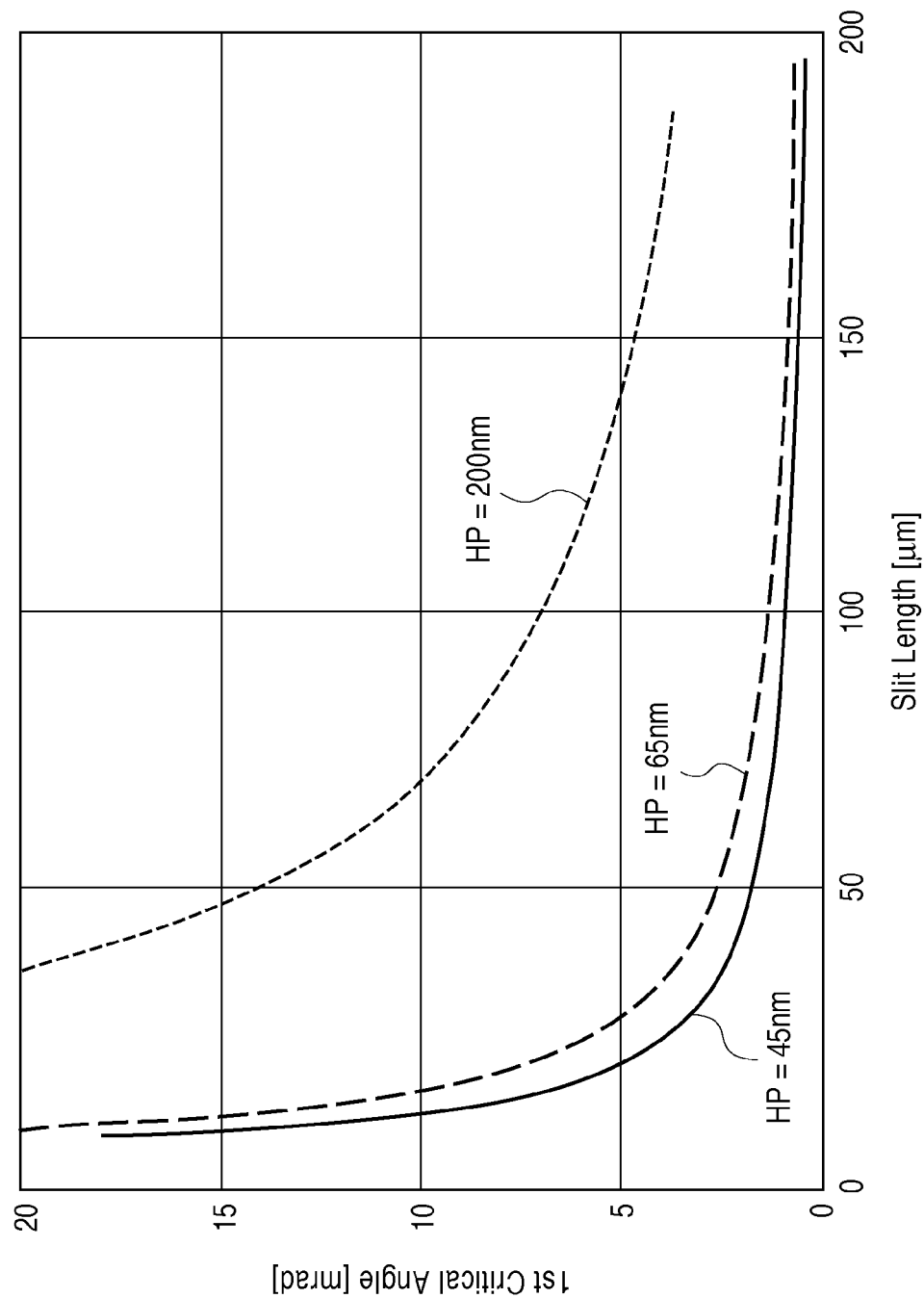

LIGHT INTENSITY DISTRIBUTION MEASUREMENT APPARATUS AND MEASUREMENT METHOD, AND EXPOSURE APPARATUS

BACKGROUND OF THE INVENTION

1. Field of the Invention

The present invention relates to a measurement apparatus and measurement method which measure the light intensity distribution, and an exposure apparatus.

2. Description of the Related Art

A method of evaluating the performance of an optical system while it is mounted in a semiconductor exposure apparatus has conventionally been proposed. This evaluation is performed by transferring by exposure a mask pattern onto a wafer coated with a resist, developing the resist, and measuring, using an SEM (Scanning Electron Microscope) or the like, a resist image formed by the development.

However, this evaluation method requires resist coating, development, and measurement processes, so it not only takes a lot of time for evaluation but also entails enormous costs. Under the circumstances, there has been proposed an evaluation method of imaging a mask pattern or measurement pattern on a plane in the air on the level flush with the wafer surface without exposure, and directly measuring the light intensity distribution of the formed aerial image (to be referred to as an aerial image measurement method hereinafter).

In order to measure a light intensity having a size that is, for example, smaller than the wavelength of a light source, a slit scan scheme which scans a slit having a width shorter than the wavelength and measures light transmitted through the slit by a light-receiving element is often adopted in the aerial image measurement method (W. N. Partlo, C. H. Fields and W. G. Oldham, "Direct aerial image measurement as a method of testing high numerical aperture microlithographic lenses", J. Vac. Sci. Technol. B, Vol. 11, pp. 2686-2691).

The conventional slit scan scheme uses, for example, a slit 54 formed in a light-shielding film 51, as shown in FIG. 10. FIG. 11 is a schematic sectional view showing a measurement apparatus of the slit scan scheme taken along a line A0-B0 in FIG. 10. A line-and-space pattern (to be referred to as an L/S pattern hereinafter) is illuminated and imaged, thereby forming an aerial image 40 having a periodic light intensity distribution. As a certain component of the light which forms the aerial image 40 is transmitted through the slit 54, the transmitted light is transmitted through a transparent substrate 52 which supports the light-shielding film 51, and enters a light-receiving unit 53. The light which has entered the light-receiving unit 53 is photo-electrically converted, and the converted light is output as a slit signal SS. A sensor 50 including the light-shielding film 51, transparent substrate 52, and light-receiving unit 53 is scanned in the x direction (a direction perpendicular to the longitudinal direction of the L/S pattern) by a stage, and the slit signal SS is monitored for each scan and step. The aerial image is measured using the signal monitored by scanning the slit (to be referred to as a slit scan signal hereinafter).

Assume that the period of a fluctuation of the light intensity distribution of the aerial image has shortened in the above-described conventional slit scan scheme. In this case, if the slit longitudinal direction is misaligned with respect to the direction in which the stripes of the L/S pattern of the aerial image extend parallelly, the degree of modulation of the slit scan signal decreases. FIG. 12 shows the longitudinal direction of the slit 54, and the direction in which an aerial image of an L/S pattern in the longitudinal direction is formed. The aerial image 40 has an L/S pattern formed to have stripes parallel to the y direction, and has its light intensity distribution modulated in the x direction at a half period. The direction in which the stripes of the L/S pattern of the aerial image 40 extend parallelly, and the longitudinal direction of the slit 54 formed in the light-shielding film 51 are misaligned in the rotation direction on the x-y plane by an angle θ. The angle θ is ideally zero to obtain a slit scan signal having a high degree of modulation. However, in practice, the angle θ never becomes zero due to alignment errors. When slit scan is performed in this state, the degree of modulation of the slit scan signal becomes lower than that of the aerial image 40. Furthermore, if the slit position is misaligned up to an angle that corresponds to one period of the L/S pattern of the aerial image or more, the amount of light which enters the slit does not change even by scanning the slit. This decreases the degree of modulation of the slit scan signal to nearly zero, so the measurement becomes impossible. An angle θc formed between the slit and the L/S pattern at this time is given by:

$$\theta c = \arcsin(2HP/SL)$$

where SL is the length of the slit in its longitudinal direction, and HP (half pitch) is the half period of a fluctuation of the light intensity distribution of the aerial image. If the angle between the slit and the L/S pattern is smaller than the angle θc, the amount of light which enters the slit can be modulated by scanning the slit. FIG. 13 is a graph obtained by plotting the function between the half pitch HP and the slit length SL, and the ordinate indicates the angle θc. As can be understood from FIG. 13, when the slit length SL is about 50 μm, the angle θc is about 14 mrad for HP=200 nm and is about 2 mrad for HP=45 nm; the latter angle is significantly smaller than the former angle. The smaller the half pitch HP, the smaller the angle θc. That is, to obtain a slit scan signal having a high degree of modulation as the tolerance of a misalignment lowers, an alignment accuracy high enough to allow the misalignment angle θ to be smaller than at least the angle θc is required.

Conventionally, a method of scanning the slit while changing the slit angle, and adjusting alignment so that the scan signal has a highest degree of modulation, for example, has been used. However, this method not only prolongs the alignment adjustment time but also decreases the alignment accuracy because a change in the degree of modulation becomes small as the degree of modulation increases to some extent.

SUMMARY OF THE INVENTION

The present invention enables to provide a measurement apparatus and measurement method which can measure the light intensity distribution with high accuracy, and an exposure apparatus.

According to a first aspect of the present invention, there is provided a measurement apparatus which illuminates a pattern inserted on an object plane of an optical system, and measures a light intensity distribution corresponding to the pattern formed on an image plane of the optical system, the apparatus comprising: a sensor including a light-shielding member having a slit and a plurality of light-receiving units, wherein the light-shielding member is inserted on the image plane of the optical system and rotates and scans, and the plurality of light-receiving units are configured to receive light transmitted through the slit; and a control unit configured to control the rotation of the light-shielding member, on the basis of a positional relationship between the plurality of light-receiving units, and phase differences between the signals detected by the plurality of light-receiving units arising from the scan of the light-shielding member.

According to a second aspect of the present invention, there is provided a measurement method for illuminating a pattern inserted on an object plane of an optical system, and measuring a light intensity distribution corresponding to the pattern formed on an image plane of the optical system, the method comprising:

receiving light transmitted through a slit using a sensor including a light-shielding member having the slit and a plurality of light-receiving units, wherein the light-shielding member is inserted on the image plane of the optical system and rotates and scans, and the plurality of light-receiving units are configured to receive light transmitted through the slit; and controlling the rotation of the light-shielding member, on the basis of a positional relationship between the plurality of light-receiving units, and phase differences between the signals detected by the plurality of light-receiving units arising from the scan of the light-shielding member.

According to a third aspect of the present invention, there is provided an exposure apparatus which projects a pattern of an original inserted on an object plane of an optical system onto a substrate by the optical system, thereby exposing the substrate, the apparatus comprising: an illumination optical system configured to illuminate the pattern inserted on the object plane of the optical system; a projection optical system configured to form a light intensity distribution corresponding to the pattern on an image plane of the optical system; and a measurement unit configured to measure the light intensity distribution through a slit in a light-shielding member inserted on the image plane by the illumination by the illumination optical system, the measurement unit including a sensor including a plurality of light-receiving units configured to receive light transmitted through the slit while the light-shielding member is rotating and scanning, and a control unit configured to control the rotation of the light-shielding member, on the basis of a positional relationship between the plurality of light-receiving units, and phase differences between the signals detected by the plurality of light-receiving units arising from the scan of the light-shielding member.

Further features of the present invention will become apparent from the following description of exemplary embodiments with reference to the attached drawings.

BRIEF DESCRIPTION OF THE DRAWINGS

FIG. 2 is a plan view showing an example of the upper surface of a sensor 50 (slit substrate) shown in FIG. 1;

FIG. 13 is a second view for explaining an error of the slit position in the prior art.

DESCRIPTION OF THE EMBODIMENT

A preferred embodiment of the present invention will now be described in detail with reference to the drawings. It should be noted that the relative arrangement of the components, the numerical expressions and numerical values set forth in these embodiments do not limit the scope of the present invention unless it is specifically stated otherwise.

This embodiment will exemplify a case in which a measurement apparatus according to the present invention is applied to an exposure apparatus, and the performance of a projection optical system provided in the exposure apparatus is evaluated.

Figure 1:
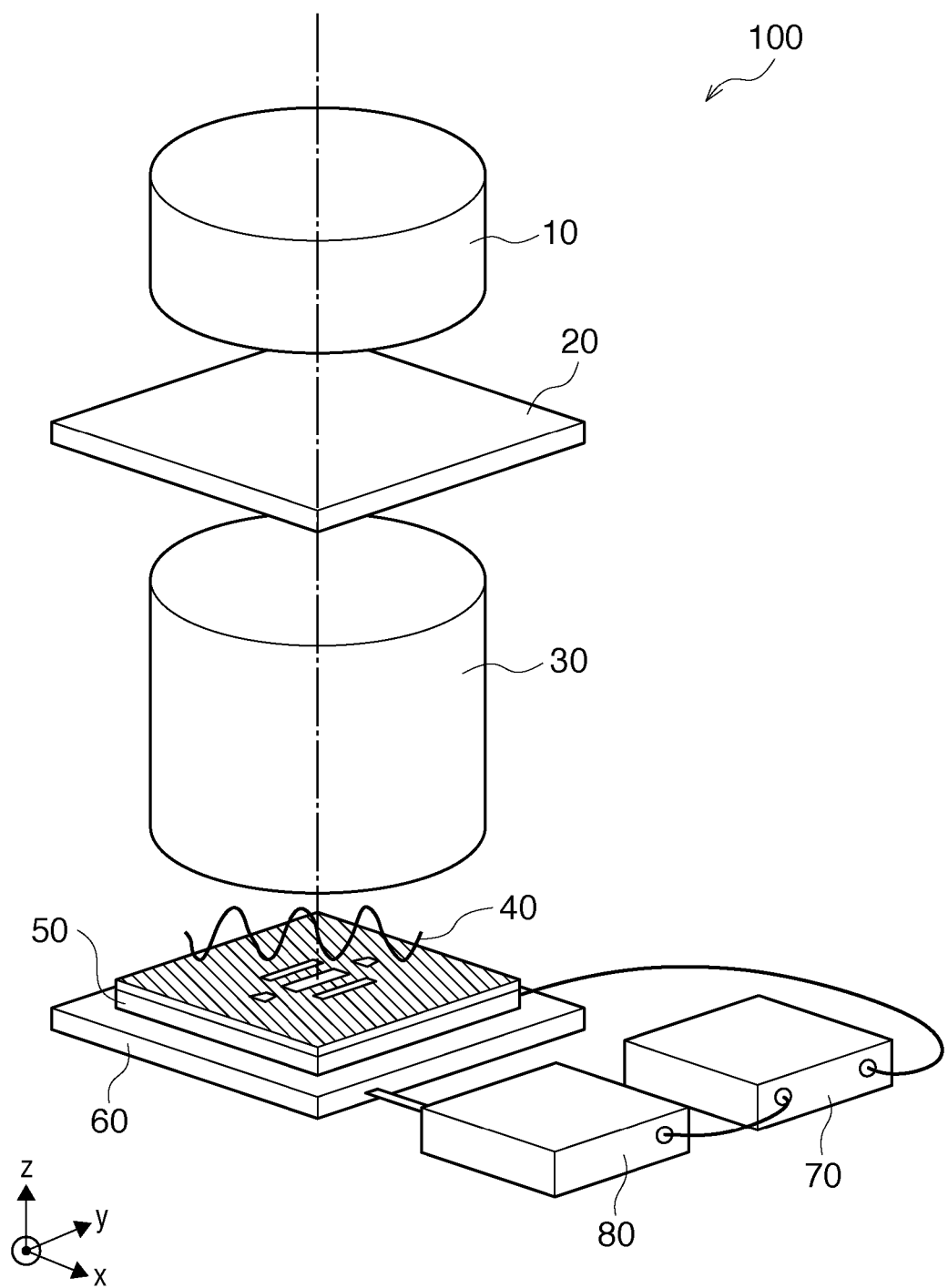
FIG. 1 is an isometric projection showing part of the arrangement of an exposure apparatus 100.

FIG. 1 is a schematic isometric projection for explaining a light intensity distribution measurement method according to the present invention. Note that FIG. 1 shows part of the arrangement of an exposure apparatus 100.

The exposure apparatus 100 includes an illumination optical system 10, projection optical system 30, sensor 50, stage 60, control unit 70, and driving unit 80.

The illumination optical system 10 applies light from a light source (not shown) onto a mask (also called an original) 20. The mask 20 is inserted on the object plane of the projection optical system 30. The projection optical system 30 forms an image of the light transmitted through the mask 20. The sensor 50 is arranged on the stage 60 and measures the intensity distribution (aerial image) of the light which has formed an image by the projection optical system 30. The control unit 70 processes the signal from the sensor 50. The driving unit 80 drives the stage 60 on the basis of the signal output from the control unit 70 to move it in the x, y, and z directions. As the stage 60 moves, the sensor 50 also moves.

Light from the light source is, for example, refracted, reflected, and diffracted by the illumination optical system 10, and is applied onto the mask 20. A pattern is formed on the mask 20 using a light-shielding film made of, for example, chromium. Applying light onto the mask 20 on which a pattern is formed generates transmitted light and diffracted light having properties that depend on the pattern. The generated transmitted light and diffracted light are guided to the projection optical system 30. The projection optical system 30 images the pattern of the mask 20 onto the image plane. An aerial image 40 which bears the influences of all of, for example, the light source, the illumination optical system 10, the pattern of the mask 20, the projection optical system 30, a mechanism which holds them, and the environment under which the exposure apparatus 100 is installed is formed on the image plane. A periodic pattern (e.g., an L/S pattern), for example, is formed on the mask 20 according to this embodiment as the measurement pattern. An aerial image formed by the light which is transmitted through the mask 20 and forms an image by the projection optical system 30 has a periodic light intensity distribution corresponding to the periodic pattern.

As a certain component of the light which forms the aerial image 40 is transmitted through a slit formed in the sensor 50, it is received by a light-receiving element (corresponding to a light-receiving unit to be described later) of the sensor 50. The light-receiving element photo-electrically converts the light received through the slit, and outputs an electrical signal to the control unit 70. The control unit 70 processes the slit signal output from the sensor 50, and outputs the processed signal to the driving unit 80. On the basis of the signal output from the control unit 70, the driving unit 80 outputs a signal for driving the stage 60 to move it. By moving the stage 60 in this way, adjustment is performed so as to reduce a misalignment (e.g., a misalignment in the rotation direction) of the slit with respect to the periodic pattern.

FIG. 2 shows an example of a plan view of the sensor 50. The sensor 50 is attached with a light-shielding film 51, in which a rectangular slit 54, for example, is formed. Letting Ws be the width of the slit in the widthwise direction, and λ be the wavelength of the light source, they must satisfy Ws≦λ to perform high-accuracy aerial image measurement which can obtain a resolution as high as a feature size smaller than the wavelength. In addition, the length of the slit 54 shown in FIG. 2 in its longitudinal direction is set to satisfy Ls≧10×λ. In this manner, setting the slit length to be relatively longer than the wavelength allows the light transmitted through the slit 54 to obtain a smaller diffraction effect in the slit longitudinal direction than in the slit widthwise direction. Therefore, the angle of divergence of the light from the slit 54 in the slit longitudinal direction is smaller than that in the slit widthwise direction. In this embodiment, while scanning the slit 54, the light which diverges from the slit 54 is photo-electrically converted by a plurality of light-receiving units (at least two light-receiving units). Using the phase differences between signals based on the photo-electric conversion results obtained by the plurality of light-receiving units, the relative position between the slit 54 and the aerial image is adjusted.

Figure 3:
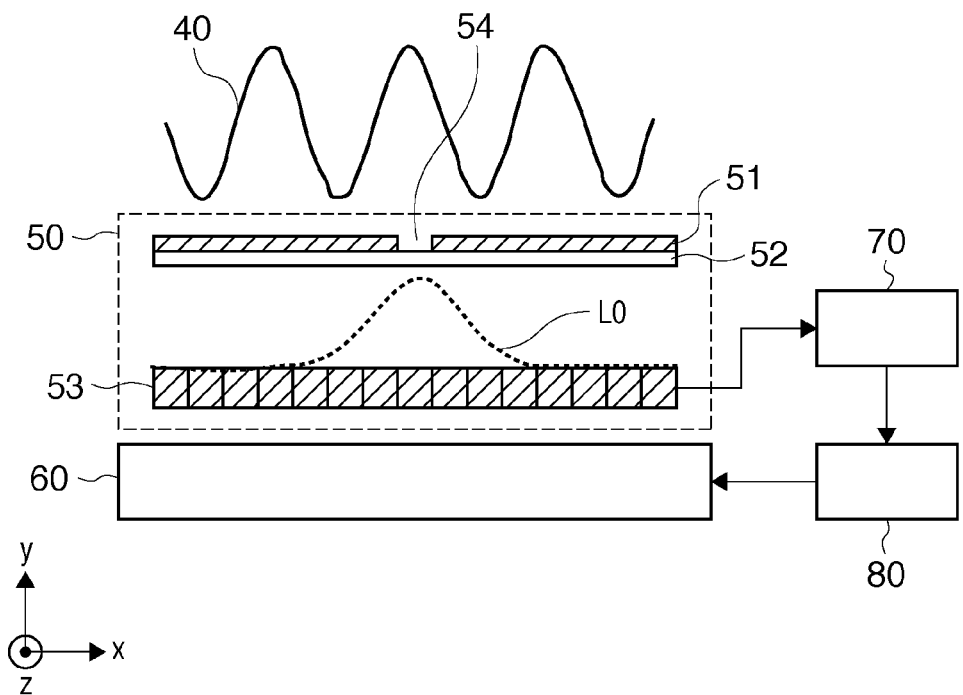
FIG. 3 is a sectional view showing an example of the section of the sensor 50 shown in FIG. 1 taken along the slit widthwise direction.

FIG. 3 shows an example of a sectional view of the sensor 50 taken along the slit widthwise direction. A case in which an aerial image 40 is formed by two-beam interference will be considered herein. A light-shielding film 51 made of a light-shielding member which shields light is formed on a transparent substrate 52 which transmits light. The light which forms the aerial image 40 is transmitted through the slit 54 and received by light-receiving units 53. The light-receiving units 53 are arranged on a two-dimensional pixel array. The signals from the light-receiving units 53 are input to the control unit 70, and stored in a memory (not shown). After that, the stage 60 moves the sensor 50 in the x direction by a distance corresponding to a spatial frequency twice or more that of the aerial image 40 so as to satisfy the sampling theorem. By repealing this operation, the light intensity distribution in the x direction can be measured. The repetition of this operation will be called slit scan measurement hereinafter. At this time, the degree of modulation of the slit scan measurement signal decreases unless the slit 54 is parallel to the direction of the stripes of the aerial image 40.

Figure 4:
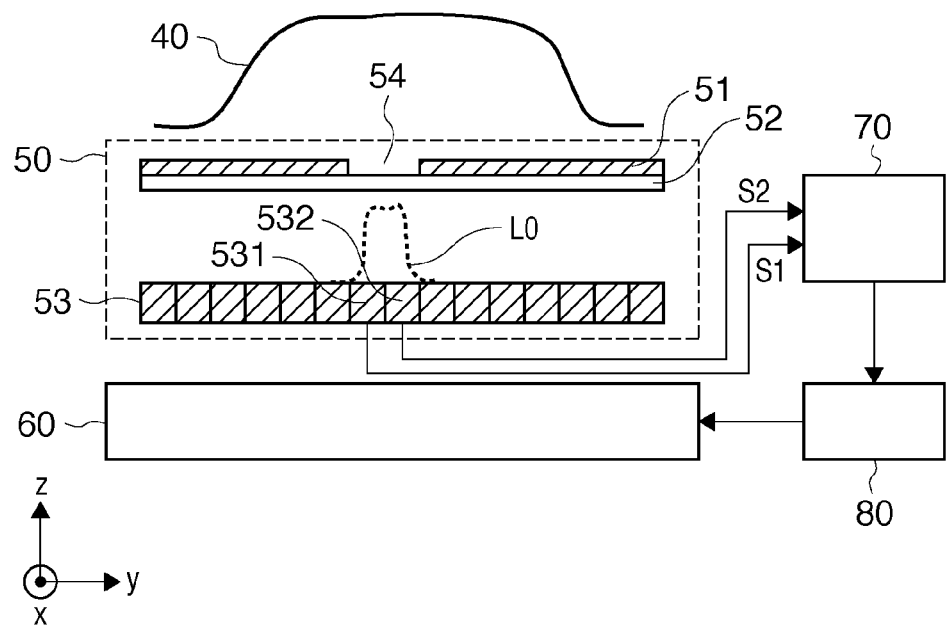
FIG. 4 is a sectional view showing an example of the section of the sensor 50 shown in FIG. 1 taken along the slit longitudinal direction.

FIG. 4 shows an example of a sectional view of the sensor 50 taken along the slit longitudinal direction. The light transmitted through the slit 54 is received by the plurality of light-receiving units 53 arranged on the two-dimensional pixel array. At this time, signals photo-electrically converted by a first light-receiving unit 531 and second light-receiving unit 532 arranged at different positions in the y direction (a direction perpendicular to the direction of the period of the periodic light intensity distribution of the aerial image 40) are indicated by S1 and S2, respectively.

Figure 5:
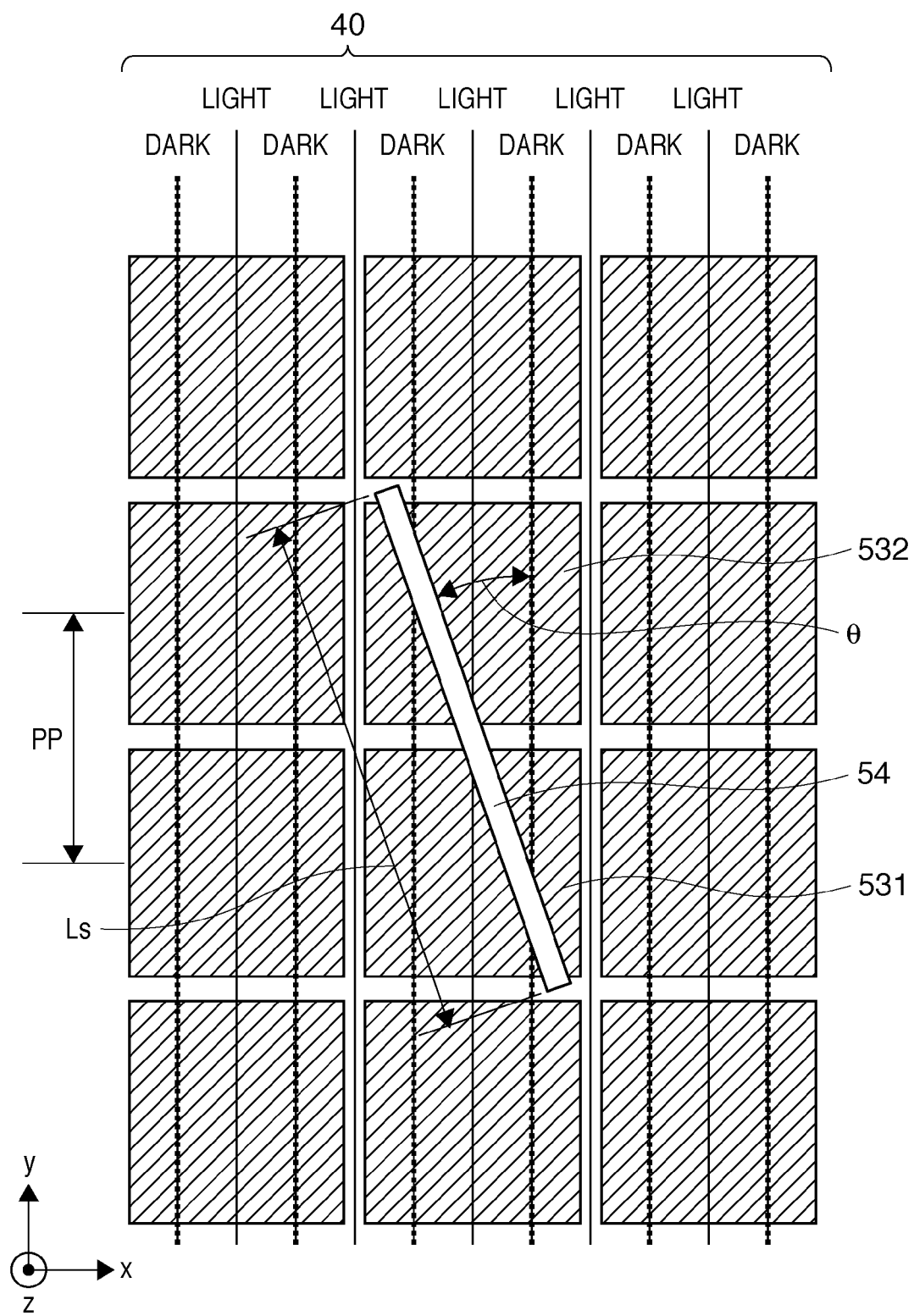
FIG. 5 is a plan view showing an example of the upper surface of the sensor 50 shown in FIG. 1.

FIG. 5 shows an example of a plan view of the sensor 50 to show the relative positions among the slit 54, the light-receiving units 531 and 532 arranged on the two-dimensional pixel array, and the aerial image 40. The slit 54 has a length Ls. The first light-receiving unit 531 and second light-receiving unit 532 arranged on the two-dimensional pixel array are spaced apart from each other by a pitch PP in the y direction. The light transmitted through the slit 54 is photo-electrically converted into signals S1 and S2 by the first light-receiving unit 531 and second light-receiving unit 532. Note that the slit longitudinal direction is assumed to be misaligned with respect to the direction of the stripes of the aerial image by an angle θ.

Figure 6:
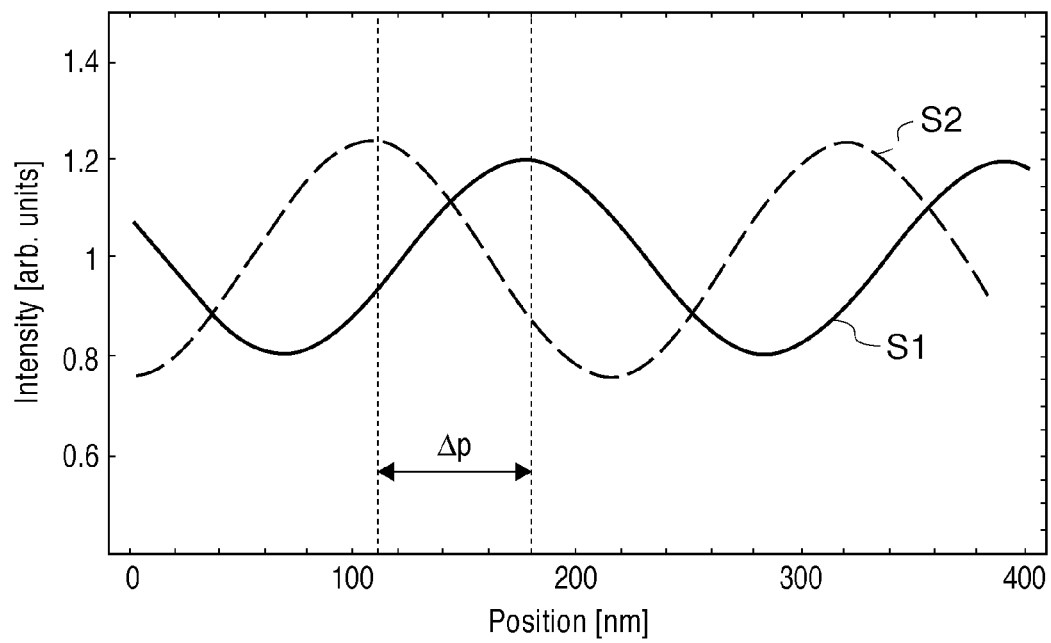
FIG. 6 is a graph showing an example of signals output from a first light-receiving unit 531 and second light-receiving unit 532.
Figure 7:
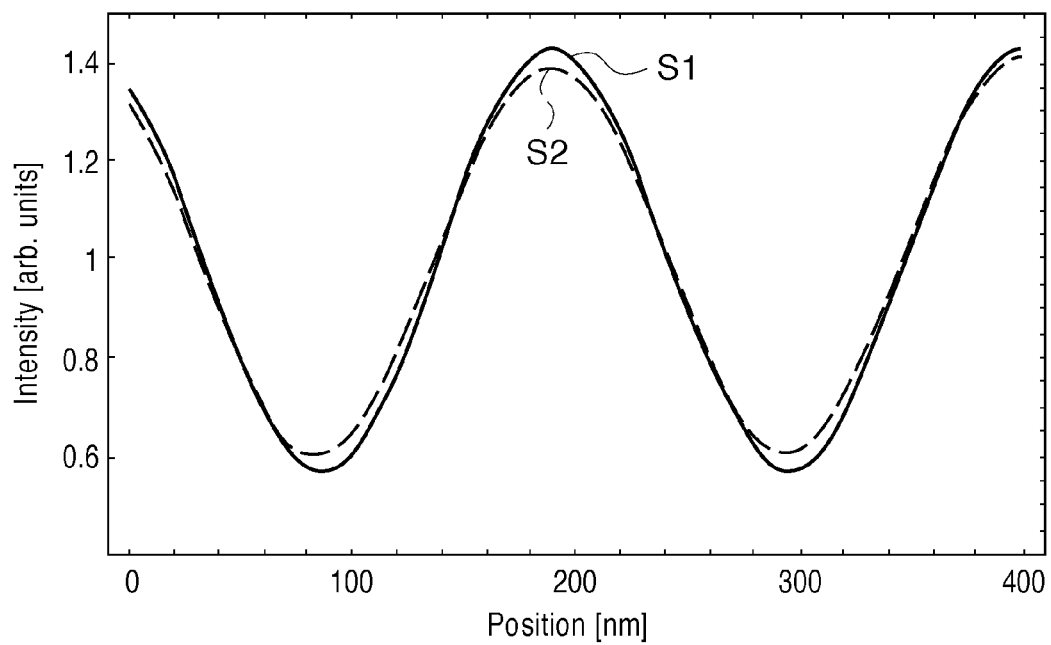
FIG. 7 is a graph showing another example of signals output from the first light-receiving unit 531 and second light-receiving unit 532.

FIG. 6 shows signals S1 and S2 stored when, for example, slit scan measurement is performed for a two-beam interference aerial image (interference fringes) having a pitch of 200 nm. If the slit longitudinal direction is misaligned with respect to the direction of the stripes of the aerial image, the signal S1 is out of phase with the signal S2, as shown in FIG. 6. Let Δp be the phase difference between these signals. Then, the angle θ formed between the slit and the stripes of the aerial image can be calculated by θ=arctan(Δp/PP). When coarse adjustment is performed to some extent, it is possible to calculate not only Δp as the retardation of the signal S2 from the signal S1 but also the polarity of the angle θ. The stage 60 is moved by using, as an alignment signal, the amount of alignment error θ calculated based on the phase difference Δp between the signals from the two light-receiving units, and the positional relationship between the two light-receiving units (the center distance PP between the two light-receiving units). The center distance PP need only be, for example, stored in a memory (not shown) in advance. FIG. 7 shows the result of performing the slit scan measurement again after the alignment of the slit is adjusted in this way. Referring to FIG. 7, the signal S1 is nearly in phase with the signal S2. That is, the slit is parallel to the stripes of the aerial image. In this state, it is possible to obtain a slit scan measurement signal having a high degree of modulation, and to minimize a decrease in the contrast of the measurement signal due to a misalignment of the slit. This arrangement allows high-speed, high-accuracy aerial image measurement. It is therefore possible to evaluate, for example, the imaging characteristics of an optical system which forms an image of light diffracted by the mask on the image plane.

As long as the slit length to detect an alignment signal is longer than the center distance between the first light-receiving unit 531 and the second light-receiving unit 532, the light transmitted through the slit can be photo-electrically converted across a relatively wide range on the first light-receiving unit 531 and the second light-receiving unit 532. This makes it possible to calculate a high-accuracy alignment signal. Although this embodiment has exemplified a case in which an alignment signal is obtained from the signals S1 and S2 from two light-receiving units, an alignment signal may be obtained and processed based on signals from three or more light-receiving units.

Although an exemplary embodiment of the present invention has been explained above, the present invention is not particularly limited to the embodiment shown in the drawings described above, and can be practiced by appropriately modifying the embodiment without departing from the spirit and scope of the present invention.

This embodiment has exemplified a case in which one slit is formed in the sensor 50. However, if the aerial image has a periodic pattern, a plurality of slits may be formed with spacings between them by a distance matching the period of the aerial image. This makes it possible to increase the amount of light transmitted through the slit, thus improving the signal-to-noise ratio in slit scan. The above-described light intensity distribution measurement is also applicable to a case in which the light intensity distribution has not a periodic pattern but an isolated pattern extending in one direction.

A light intensity distribution measurement slit for actually measuring the light intensity distribution from an aerial image may be different from an alignment (slit position control) slit. In this arrangement, high alignment accuracy can be achieved by, for example, setting the alignment slit for use in alignment to be longer than that of the measurement slit for use in actual aerial image measurement. In this case, it is also possible to reduce a misalignment between the measurement slit and the stripes of the aerial image.

Figure 8:
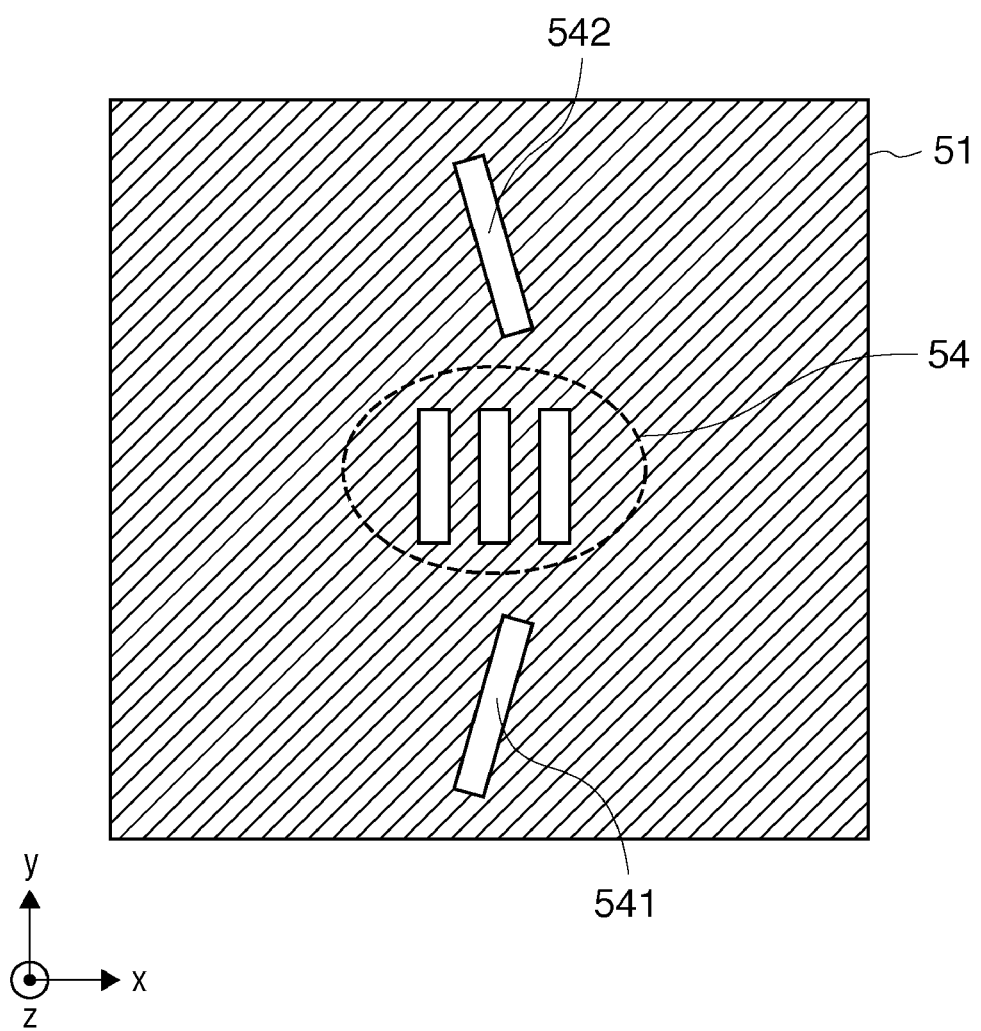
FIG. 8 is a plan view showing an example of the upper surface of a slit substrate.

FIG. 8 shows an example of a plan view of a slit substrate in which a plurality of slits are formed. By performing the alignment method according to this embodiment using a second slit 541 and third slit 542, the alignment accuracy can be further increased as compared with the above-described case.

An alignment slit may be set at an angle different from that of a measurement slit, and an alignment signal may be obtained in accordance with the angle at which the alignment slit is set, which is stored in advance. In this case, even when the measurement slit is nearly parallel to the stripes of the aerial image, it is possible to obtain an alignment signal having a high sensitivity, using the alignment slit, thus allowing high-accuracy light intensity distribution measurement. It is also possible to measure an aerial image having a two-dimensional pattern by two-dimensionally scanning a pinhole in place of the measurement slit.

Alignment slits having different lengths may be formed so that a long alignment slit is used for coarse adjustment and a short alignment slit is used for fine adjustment.

Figure 9:
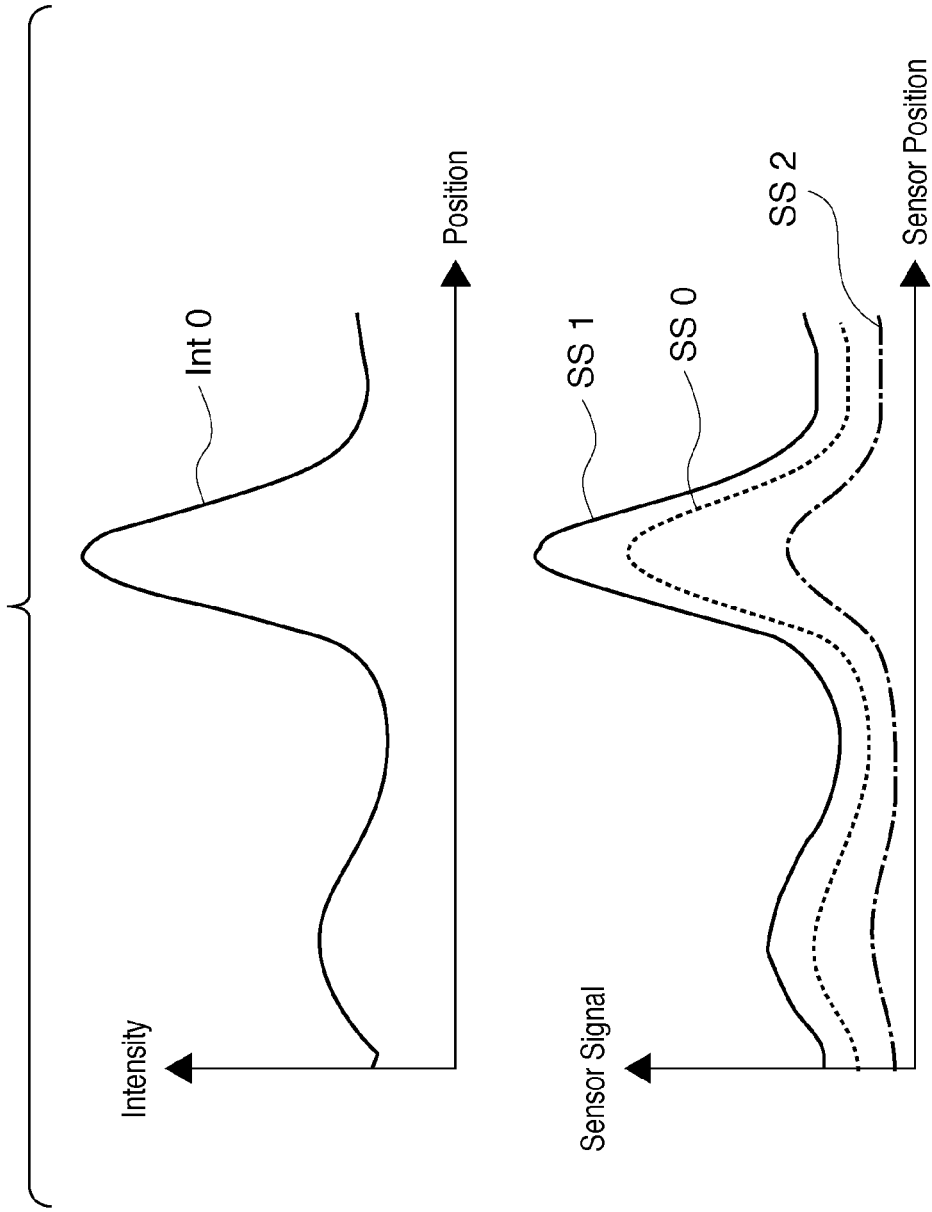
FIG. 9 is a graph showing an example of slit scan signals.
Figure 10:
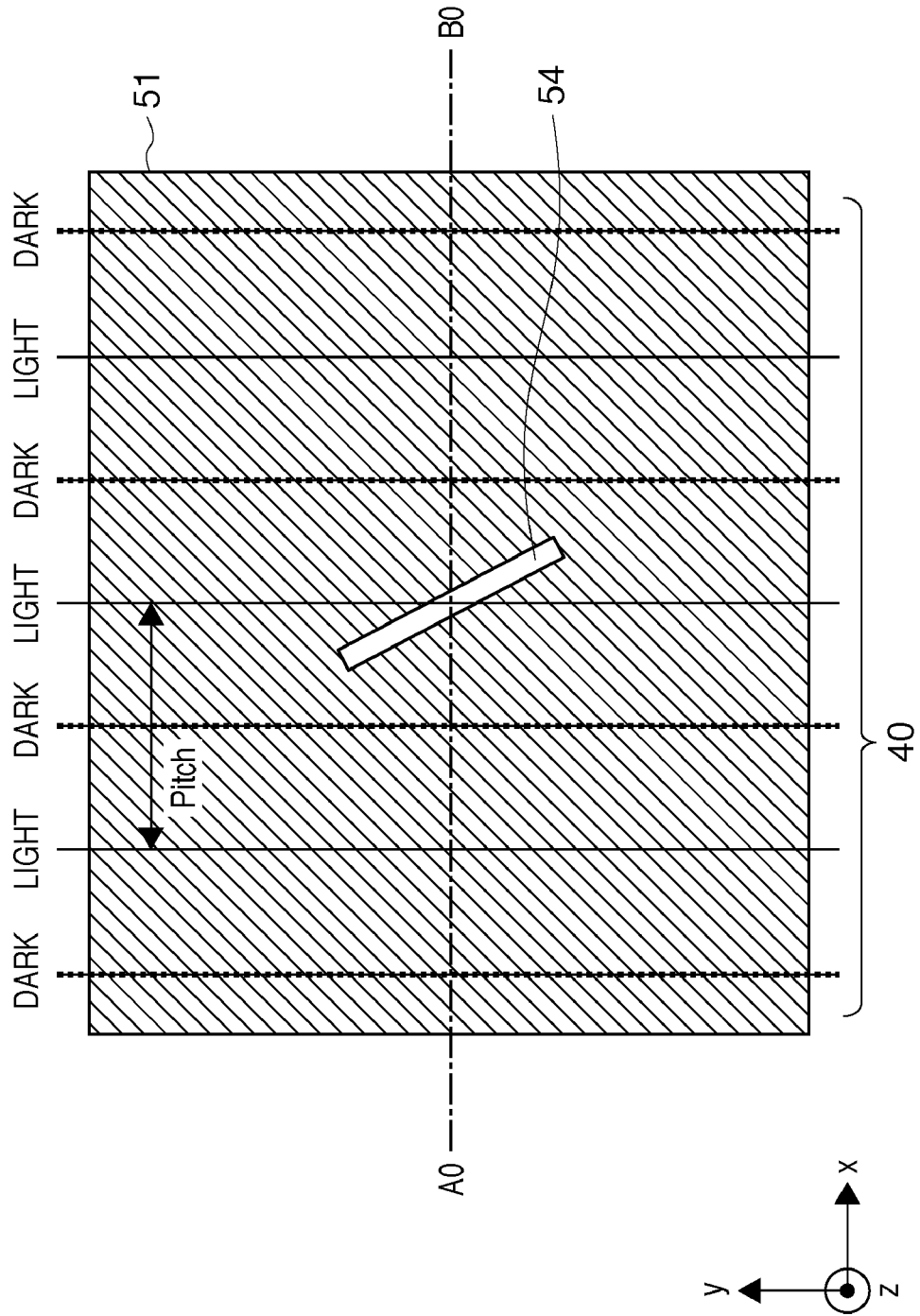
FIG. 10 is a plan view showing an example of the upper surface of a conventional slit substrate.
Figure 11:
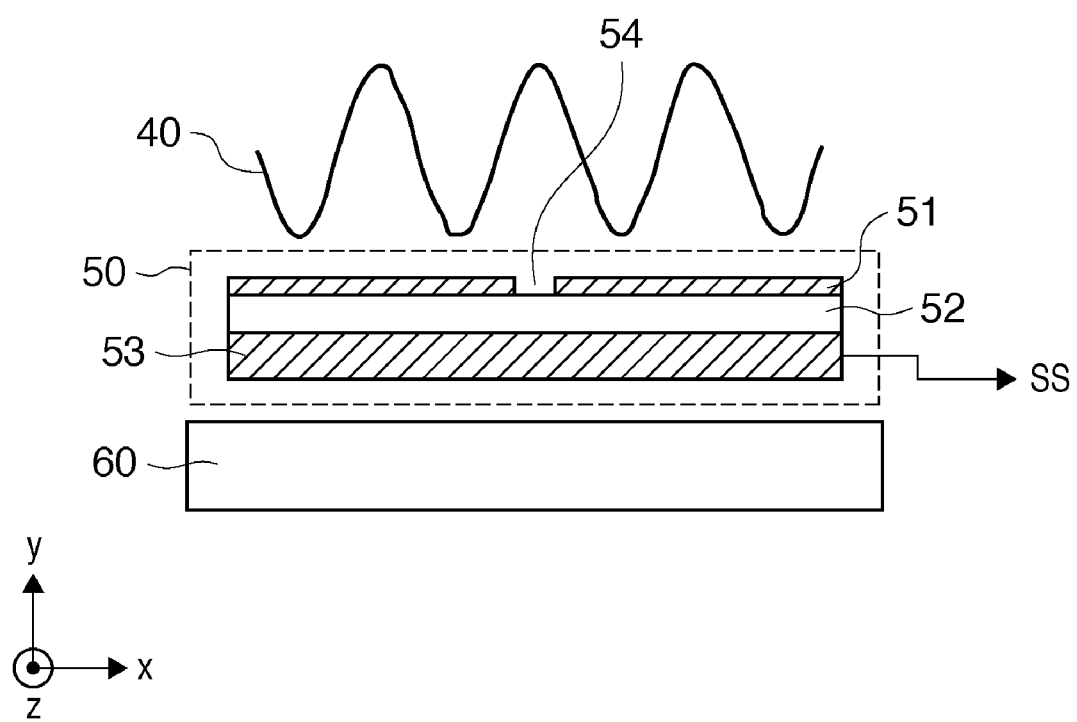
FIG. 11 is a sectional view showing the section of a conventional sensor.
Figure 12:
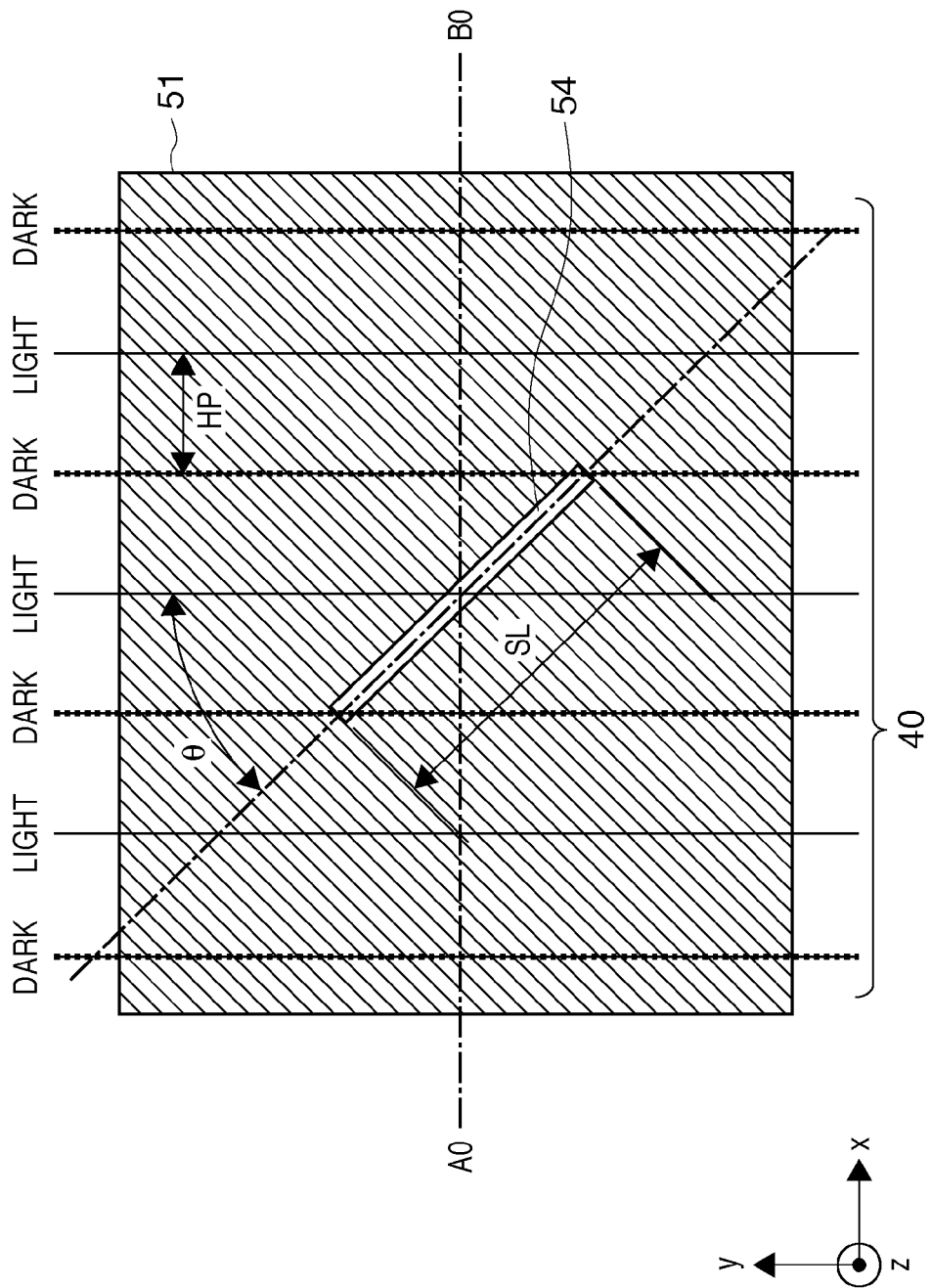
FIG. 12 is a first view for explaining an error of the slit position in the prior art.

FIG. 9 is a schematic view showing general slit scan signals. Assume that an aerial image intensity distribution formed by an optical system has a section Int0. In this case, if the slit and the aerial image are misaligned, a slit scan signal having a degree of modulation significantly lower than that of the original aerial image is output, as indicated by SS2. However, when the slit and the aerial image are aligned using the light intensity distribution measurement method according to this embodiment, a signal having a high degree of modulation as indicated by SS0 can be obtained. Nevertheless, because a slit scan signal of light transmitted through a slit formed in a light-shielding film having a finite thickness is detected in this case, this signal is generated by convoluting the slit transmitting characteristics to the light intensity distribution of an actual aerial image. By performing a restoration process such as deconvolution for this signal on the basis of slit transmitting characteristics stored in, for example, a memory in advance, or those calculated by a computer, a signal SS1 close to the actual aerial image can be measured. That is, the detected slit scan signal may be corrected by taking account of the slit transmitting characteristics. The above-described method can provide a high-accuracy light intensity distribution measurement method that does not depend on the slit shape.

Mounting an apparatus, to which the light intensity distribution measurement method according to this embodiment is applied, onto a stage of a semiconductor exposure apparatus or the like as, for example, a measurement unit allows high-accuracy aerial image measurement and optical system evaluation. This makes it possible to decrease the manufacturing cost of the semiconductor exposure apparatus and increase its imaging performance. This measurement unit may be mounted at a position other than that matching the stage. This measurement unit need not always be mounted at all times, and may be temporarily set at a position corresponding to the wafer surface and detached after the measurement.

According to the present invention, it is possible to measure the light intensity distribution with high accuracy.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-007205 filed on Jan. 16, 2008, which is hereby incorporated by reference herein in its entirety.

What is claimed is:

1. A measurement apparatus which illuminates a pattern inserted on an object plane of an optical system, and measures a light intensity distribution corresponding to the pattern formed on an image plane of the optical system, the apparatus comprising:
   a sensor including a light-shielding member, a light transmissive slit and a plurality of light-receiving units configured to receive light transmitted through the light transmissive slit, wherein each of the plurality of light-receiving units receives light transmitted through region different from each other within the light transmissive slit; and
   a control unit configured to control the sensor to move on a side of the image plane of the optical system to detect the light intensity distribution, obtain signals of light transmitted through the light transmissive slit and received by each of the plurality of light-receiving units, and control an angle of the light transmissive slit so that phase differences between the signals is reduced.

2. The apparatus according to claim 1, wherein a length of the light transmissive slit in a widthwise direction is smaller than a wavelength of an illumination light of the pattern, and a length of the light transmissive slit in a longitudinal direction is longer than a center distance between the plurality of light-receiving units.

3. The apparatus according to claim 1, wherein the plurality of light-receiving units include a two-dimensional pixel array.

4. The apparatus according to claim 1, wherein
   the light transmissive slit includes
   a measurement slit configured to measure the light intensity distribution, and
   an alignment slit set at an angle different from an angle at which the measurement slit is set, and
   the control unit controls the plurality of light-receiving units to detect signals using the alignment slit, controls an angle of the measurement slit, on the basis of a positional relationship between the plurality of light-receiving units, and phase differences between the signals detected by the plurality of light-receiving units, and measures the light intensity distribution using the measurement slit.

5. The apparatus according to claim 1, wherein
   the light transmissive slit includes
   a measurement slit configured to measure the light intensity distribution, and
   an alignment slit having a larger dimension in a longitudinal direction than the measurement slit, and
   the control unit controls the plurality of light-receiving units to detect signals using the alignment slit-, controls an angle of the measurement slit, on the basis of a positional relationship between the plurality of light-receiving units, and phase differences between the signals detected by the plurality of light-receiving units, and measures the light intensity distribution using the measurement slit.

6. The apparatus according to claim 1, wherein the slit scan signals obtained by receiving the light through the light transmissive slit are corrected using transmitting characteristics of the light transmissive slit.

7. A measurement method for illuminating a pattern inserted on an object plane of an optical system, and measuring a light intensity distribution corresponding to the pattern formed on an image plane of the optical system, the method comprising:

receiving light transmitted through a light-transmissive slit using a sensor including a light-shielding member having the light-transmissive slit and a plurality of light-receiving units configured to receive light transmitted through the light transmissive slit, wherein each of the plurality of light-receiving units receives light transmitted through region different from each other within the light transmissive slit; and controlling the sensor to move on a side of the image plane of the optical system to detect the light intensity distribution, obtain signals of light transmitted through the light transmissive slit and received by each of the plurality of light-receiving units, and control an angle of the light transmissive slit so that phase differences between the signals is reduced.

8. The apparatus according to claim 1, wherein a length of the light transmissive slit in longitudinal direction is not less than ten times as a wavelength of an illumination light of the pattern.

* * * * *